US008022466B2

(12) United States Patent
Lai et al.

(10) Patent No.: US 8,022,466 B2
(45) Date of Patent: *Sep. 20, 2011

(54) NON-VOLATILE MEMORY CELLS HAVING A POLYSILICON-CONTAINING, MULTI-LAYER INSULATING STRUCTURE, MEMORY ARRAYS INCLUDING THE SAME AND METHODS OF OPERATING THE SAME

(75) Inventors: Erh-Kun Lai, Taichung County (TW);
Yen-Hao Shih, Taipei County (TW);
Tzu-Hsuan Hsu, Chiayi County (TW);
Shih-Chih Lee, Yunlin County (TW);
Jung-Yu Hsieh, Hsinchu (TW);
Kuang-Yeu Hsieh, Hsin Chu (TW)

(73) Assignee: Macronix International Co., Ltd., Hsinchu (TW)

( * ) Notice: Subject to any disclaimer, the term of this patent is extended or adjusted under 35 U.S.C. 154(b) by 391 days.

This patent is subject to a terminal disclaimer.

(21) Appl. No.: 11/588,830

(22) Filed: Oct. 27, 2006

(65) Prior Publication Data
US 2008/0099826 A1    May 1, 2008

(51) Int. Cl.
*H01L 29/792* (2006.01)
(52) U.S. Cl. ........ 257/324; 257/314; 257/315; 257/321; 257/326; 257/E29.309; 257/E21.423
(58) Field of Classification Search .............. 257/321, 257/322, 324, E21.423, E29.309, 314, 315, 257/326
See application file for complete search history.

(56) References Cited

U.S. PATENT DOCUMENTS

| 4,173,766 | A | 11/1979 | Hayes |
| 6,011,725 | A | 1/2000 | Eitan |
| 6,624,028 | B1 | 9/2003 | Wen |
| 6,680,509 | B1 | 1/2004 | Wu et al. |
| 6,885,590 | B1 | 4/2005 | Zheng et al. |
| 7,098,505 | B1 * | 8/2006 | Han et al. ............... 257/324 |
| 7,450,423 | B2 * | 11/2008 | Lai et al. ............ 365/185.18 |
| 2003/0030100 | A1 | 2/2003 | Lee et al. |
| 2003/0224564 | A1 | 12/2003 | Kang et al. |
| 2004/0079983 | A1 | 4/2004 | Chae et al. |
| 2004/0152260 | A1 | 8/2004 | Rabkin et al. |
| 2005/0101089 | A1 | 5/2005 | Kim et al. |

OTHER PUBLICATIONS

U.S. Appl. No. 11/197,668 entitled: Non-Volatile Memory Semiconductor Device having an Oxide-Nitride-Oxide (ONO) Top Dielectric Layer; filed Aug. 4, 2005; Inventors: Lue at al.; 29 pages.

(Continued)

*Primary Examiner* — Ha Tran T Nguyen
*Assistant Examiner* — Suberr Chi
(74) *Attorney, Agent, or Firm* — Jianq Chyun IP Office

(57) ABSTRACT

Memory cells including a semiconductor layer having at least two source/drain regions disposed below a surface of the semiconductor layer and separated by a channel region; a lower insulating layer disposed above the channel region; a charge storage layer disposed above the lower insulating layer; an upper insulating multi-layer structure disposed above the charge storage layer, wherein the upper insulating multi-layer structure comprises a polysilicon material layer interposed between a first dielectric layer and a second dielectric layer; and a gate disposed above the upper insulating multi-layer structure are described along with arrays thereof and methods of operation.

31 Claims, 3 Drawing Sheets

OTHER PUBLICATIONS

Chindalore, G.L., et al., A New Combination-Erase technique for Erasing nitride Based (SONOS) Nonvolatile Memories, IEEE Electron Device letters, vol. 24, No. 4, Apr. 2003 Silicon Devices, pp. 257-259.

Eitan, B., et al., NROM: A Novel Localized Trapping, 2-Bit Nonvolatile Memory Cell, IEEE Electron Device Letters, vol. 21, No. 11, Nov. 2000, pp. 543-545.

Han, J.H., et al., Fully Compatible Novel SNONOS Structure for Improved Electrical Performance in NAND Flash Memories; Materials & Devices Research Center, Samsung Advanced Institute of Technology; 2005; pp. 223-226.

Han, J.H., et al., Novel SNONOS Structure for Improved Electrical Performance in Non-Volatile NAND Flash Memories; Materials & Devices Research Center, Samsung Advanced Institute of Technology;May 24, 2005; 15 pages.

Ito, F., et al., A Novel MNOS technology Using Gate Hole Injection in Erase Operation for Embedded Nonvolatile Memory Applications, 2004 Symposium on VLSI technology Digest of Technical Papers, pp. 80-81.

Minami, S., et al., New Scaling Guidelines for MNOS Nonvolatile Memory Devices, IEEE Transactions on Electron Devices, vol. 38, No. 11, Nov. 1991, pp. 2519-2526.

Ohba, R., et al., 35 nm Floating Gate Planer MOSFET Memory Using Double Junction Tunneling; Advanced LSI Technology Laboratory, Toshiba Corporation; IEEE; 2005; 4 pages.

Ohba, R., et al., Impact of Stoichiometry Control in Double Junction Memory on Future Scaling; Advanced LSI Technology Laboratory, Toshiba Corporation; IEEE; 2004; 4 pages.

Sung, S.K., et al., Multi-Layer SONOS with Direct Tunnel Oxide for High Speed and Long Retention Time, IEEE 2002 Silicon Nanoelectronics Workshop, (Honolulu, HI, USA) Jun. 9-10, 2002 pp. 83-84.

Walker, A.J., 3D TFT-SONOS Memory Cell for Ultra-High Density File Storage Applications, 2003 Symposium on VLSI Technology Digest of Technical Papers, 2 pages (unnumbered).

White, M.H., et al., On the Go with SONOS, IEEE, Circuits & Devices, Jul. 2000, pp. 22-31.

\* cited by examiner

NON-VOLATILE MEMORY CELLS HAVING A POLYSILICON-CONTAINING, MULTI-LAYER INSULATING STRUCTURE, MEMORY ARRAYS INCLUDING THE SAME AND METHODS OF OPERATING THE SAME

BACKGROUND OF THE INVENTION

Non-volatile memory ("NVM") refers to semiconductor memory which is able to continually store information even when the supply of electricity is removed from the device containing the NVM cell. NVM includes Mask Read-Only Memory (Mask ROM), Programmable Read-Only Memory (PROM), Erasable Programmable Read-Only Memory (EPROM), Electrically Erasable Programmable Read-Only Memory (EEPROM), and Flash Memory. Non-volatile memory is extensively used in the semiconductor industry and is a class of memory developed to prevent loss of programmed data. Typically, non-volatile memory can be programmed, read and/or erased based on the device's end-use requirements, and the programmed data can be stored for a long period of time.

Non-volatile memory devices can employ various designs, including devices which have charge storage layers of the "floating gate" type and devices which have charge-trapping layers that store charge in a localized manner. Localized charge storage (or trapping) refers to the ability of a charge-trapping layer to store charge without significant lateral movement of the stored charge throughout the layer. Conventional "floating gate" memory cells contain a charge-storage layer which is conductive and in which the stored charge is spread laterally throughout the entire layer (i.e., throughout the entire floating gate).

As the information technology market has grown vastly in the past twenty years or so, portable computers and the electronic communications industry have become the main driving force for semiconductor VLSI (very large scale integration) and ULSI (ultra large scale integration) design. As a result, low power consumption, high density and re-programmable non-volatile memory are in great demand. These types of programmable and erasable memories have become essential devices in the semiconductor industry.

A rising demand for memory capacity has translated into higher requirements for integration level and memory density. Dual bit cells which can store two bits of information in each memory cell are known in the art but are not yet prevalent in use. Some dual bit cells have multiple threshold voltage levels, where every two threshold voltage levels together store a different bit. These types of dual bit cells involve operational complexities which discourage their widespread use. Other dual bit cells employ charge-trapping layers and have two separate storage sites and store one bit in each site on either side of the cell. One kind of dual bit cell of the latter variety is known as Nitride Read Only Memory (NROM).

In general, an NROM cell uses a thicker tunnel oxide layer between the semiconductor layer and the charge-trapping nitride layer to prevent charge loss during retention states. However, a thick tunnel oxide layer may impact channel erase speed. As a result, band-to-band tunneling hot-hole (BT-BTHH) erase methods are often used to inject hole traps from the channel to compensate the stored electrons. However, the BTBTHH erase methods may cause reliability issues. For example, the performance characteristics of NVM devices employing BTBTHH erase methods may rapidly degrade after numerous P/E (program/erase) cycles due to semiconductor layer/oxide interface damage which can occur as a result of the BTBTHH methods. For purposes of this invention, the "semiconductor layer" refers to that layer in which the source/drain regions are proximate to the layer's surface and the "semiconductor substrate" or "substrate" refers to a support or insulation layer contiguous to the semiconductor layer that does not contain source/drain regions. Not all semiconductor devices have semiconductor substrates and in those instances the semiconductor layer is commonly considered to also be the substrate.

Another example of a charge-trapping NVM cell design is the so-called SONOS (silicon-oxide-nitride-oxide-silicon) device, which can include a thin tunnel oxide layer between the semiconductor layer and the charge-trapping layer to allow hole direct tunneling erase operations. Although such designs can have good erase speed, the data retention is usually poor, in part, because direct tunneling may occur even at a low electrical field strengths that may exist during a retention state of a memory device.

Thus, a need in the art exists for non-volatile memory cell designs and arrays which can be repeatedly programmed and erased numerous times with improved data retention performance, increased operation speeds and which do not suffer semiconductor layer/oxide interface degradation as a result of hot hole tunneling from the semiconductor layer.

BRIEF SUMMARY OF THE INVENTION

The present invention relates to non-volatile memory cells and devices containing such cells, and more specifically, to a non-volatile memory cell design which includes an insulating polysilicon-containing, multi-layer structure disposed between a charge storage layer and a gate which facilitates positive voltage erase operations and which permits gate-injected hole erasing. The present invention also relates to the operation of such memory cells. Positive voltage erase operations in accordance with various embodiments of the present invention can reduce semiconductor layer/oxide interface damage which can occur when band-to-band hot hole injection from the semiconductor layer is used as an erase method in memory cells. As negative gate biasing is not necessary then the peripheral circuits involved can be simpler and more compact.

One embodiment of the present invention includes a memory cell comprising: a semiconductor layer having at least two source/drain regions disposed below a surface of the semiconductor layer and separated by a channel region; a lower insulating layer disposed above the channel region; a charge storage layer disposed above the lower insulating layer; an upper insulating multi-layer structure disposed above the charge storage layer, wherein the upper insulating multi-layer structure comprises a polycrystalline silicon (also referred to herein as "polysilicon") material layer interposed between a first dielectric layer and a second dielectric layer; and a gate disposed above the upper insulating multi-layer structure.

Another embodiment of the present invention includes a memory cell comprising: a silicon semiconductor layer having at least two source/drain regions disposed below a surface of the semiconductor layer and separated by a channel region; a silicon oxide insulating layer disposed above the channel region; a silicon nitride charge storage layer disposed above the silicon oxide insulating layer; an upper insulating multi-layer structure disposed above the charge storage layer, wherein the upper insulating multi-layer structure comprises a polysilicon material layer interposed between a first silicon oxide dielectric layer and a second silicon oxide dielectric layer, wherein the polysilicon material layer has a thickness of about 10 to 30 Angstroms, the first silicon oxide dielectric layer has a thickness of about 25 to 35 Angstroms, and the second silicon oxide dielectric layer has a thickness of about 10 to 30 Angstroms; and a gate disposed above the upper insulating multi-layer structure, wherein the gate comprises a p-doped polysilicon layer.

The present invention also includes non-volatile memory devices which comprise a plurality of memory cells (i.e., an array) in accordance with one or more of the embodiments of cells described herein. As used herein, the term "plurality" and the phrase "at least two" synonymously refer to two or more of the element to which the term or phrase refers. Additionally, as used herein, the singular indefinite articles "a" and "an", and the definite article "the" include plural referents unless the context clearly dictates otherwise. Thus, for example, reference to "a memory cell" can include a plurality of such memory cells.

Memory devices in accordance with the present invention exhibit significantly improved operational properties including improved charge retention and improved durability as a result of diminished erase-induced interface damage. Erase voltages of approximately 10 Volts are sufficient. This is a lower erase voltage than is sufficient for NAND flash memory. Also, this invention allows for less induced interface damage, where the interface exists, as the weighting factor is much less than Band-to-Band Hot Hole erase due to the interface occurring near the gate and not near the surface channel.

The present invention also includes methods of operating non-volatile memory cells and arrays. One embodiment of a method of operation in accordance with the present invention includes operating a memory cell in accordance with the present invention by applying a positive voltage to the gate sufficient to cause hole tunneling from the gate toward the charge storage layer.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Reference will now be made in detail to the invention and the presently preferred embodiments thereof, examples of which are illustrated in the accompanying drawings. It should be noted that the non-graph drawing is in greatly simplified form and is not to precise scale. In reference to the disclosure herein, for purposes of convenience and clarity only, directional terms, such as top, bottom, left, right, up, down, above, below, beneath, rear, and front, are used with respect to the accompanying drawings. Such directional terms used in conjunction with the following description of the drawings should not be construed to limit the scope of the invention in any manner not explicitly set forth in the appended claims. Although the disclosure herein refers to certain illustrated embodiments, it is to be understood that these embodiments are presented by way of example and not by way of limitation. It is to be understood and appreciated that the process steps and structures described herein do not cover a complete process flow for the manufacture of entire integrated circuits. The present invention may be practiced in conjunction with various integrated circuit fabrication techniques that are known in the art or to be developed.

Memory cells, arrays containing two or more of such cells and devices containing such cells and/or arrays in accordance with the present invention can overcome some of the reliability issues in NVM devices, and particularly memory devices which employ nitride charge storage. Memory cell structures in accordance with the present invention allow positive voltage, gate-injected hole-tunneling erase methods, while at the same time, such structures maintain good charge retention characteristics. Various embodiments of the memory cells according to the present invention alleviate reliance on BTBTHH erase methods, thereby avoiding device degradation after numerous P/E cycles due to semiconductor layer/oxide interface damage. As negative gate biasing is not necessary then the peripheral circuits involved can be simpler and more compact. Erase voltages of approximately 10 Volts are sufficient. This is a lower erase voltage than is sufficient for NAND flash memory. Also, this invention allows for less induced interface damage, where the interface exists, as the weighting factor is much less than Band-to-Band Hot Hole erase due to the interface occurring near the gate and not near the surface channel.

Figure 1:
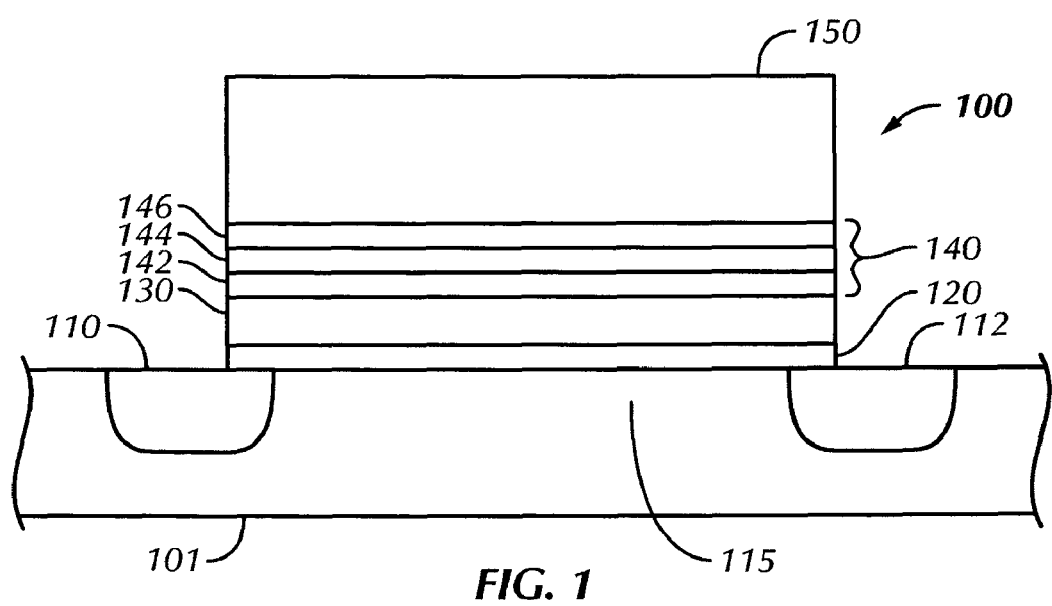
FIG. 1 is cross-sectional schematic representation of a memory cell in accordance with one embodiment of the present invention.

FIG. 1 depicts a cross-sectional schematic representation of a memory cell 100 in accordance with one embodiment of the present invention. The memory cell includes a semiconductor layer 101 containing at least two source/drain regions 110 & 112, wherein each of the source/drain regions 110 & 112 may function as either a source or a drain depending upon voltages applied. The semiconductor layer 101 further includes a channel region 115 between the two source/drain regions. The memory cell 100 further includes a lower insulating layer 120 disposed above the channel region 115, though not necessarily directly on the surface of the semiconductor layer 101. For example, an additional layer or layers may optionally be disposed between the surface of the semiconductor layer and the lower insulating layer, such as, a gate oxide layer (not shown) disposed on the surface of the semiconductor layer. The memory cell 100 further includes a charge storage layer 130 disposed above the lower-insulating layer 120. The memory cell 100 further includes an upper insulating multi-layer structure 140 having a polysilicon layer 144 interposed between a first dielectric layer 142 and a second dielectric layer 146. The memory cell 100 further includes a gate 150 disposed above the upper insulating multi-layer structure 140. The invention can be applied to a memory cell with a conventional silicon semiconductor layer without a substrate as well as a silicon on insulator (SOI), a thin film transistor (TFT) process or a vertical transistor process. For purposes of this invention, the "semiconductor layer" refers to that layer in which the source/drain regions are proximate to the layer's surface and the "semiconductor substrate" or "substrate" refers to a support or insulation layer contiguous to the semiconductor layer that does not contain source/drain regions. Not all semiconductor devices have semiconductor substrates and in those instances the semiconductor layer is commonly considered to also be the substrate.

A memory cell in accordance with the present invention comprises a semiconductor layer. Any semiconductor layer material suitable for use in semiconductor devices may be used. In many preferred embodiments of the present invention, the semiconductor layer comprises a silicon material. Silicon wafers prepared via standard techniques can be used to prepare a suitable semiconductor layer. For example, suitable wafers can be prepared via a process wherein silicon is grown from a small crystal, called the seed crystal, rotated and slowly withdrawn from a molten hyper-pure silicon to give a cylindrical crystal, which is then sliced to obtain thin disks, which after slicing, are finely ground, mirror-smooth polished and cleaned. Thus, for example, in FIG. 1, semiconductor layer 101 can comprise a silicon wafer.

In accordance with several preferred embodiments of the present invention, the semiconductor layer comprises p-type silicon. Generally, p-type silicon semiconductor layers capable of use in accordance with preferred embodiments of the present invention include silicon wafers which have been lightly p-doped. In those embodiments of the present invention wherein the source/drain regions comprise n+ doped implants, a lightly p-doped semiconductor layer can be advantageous in programming and reading of the memory cell due to the reverse bias of the PN junctions. P-type doping of a semiconductor layer such as silicon can be carried out in any suitable manner, such as, via an implantation of, for example, boron, $BF_2$ or gallium or any other free-electron deficient element capable of use in semiconductor materials. Preferably, the p-type doping is carried out at a dosage level of from about $10^{13}/cm^3$ to about $10^{16}/cm^3$ More preferably, the p-type doping is carried out at a dosage level of from about $10^{14}/cm^3$ to about $10^{15}/cm^3$.

It should be understood that while some of the embodiments of the invention described herein depict NPN junctions wherein the semiconductor layer comprises a p-type semiconductor layer having two or more source/drain regions formed via n-type doping to create an NPN cell, the memory cells of the present invention also include PNP type semiconductor devices, and the methods of the present invention can be employed to prepare PNP memory. PNP memory is programmed with the Band-to-Band hot election method where a negative voltage is applied to the source/drain region and a positive voltage is applied to the gate to generate Band-to-Band hot electron transfer. PNP is erased via FN hole injection by applying positive voltage to the gate to induce a hole into the trapping layer.

A memory cell in accordance with the present invention has a source region and a drain region, which are collectively also referred to herein as at least two source/drain regions. As is understood by those of ordinary skill in the art, each memory cell comprises two source/drain regions, each of which may serve as a source or a drain, depending upon the location and level of the applied voltages. The term "source/drain region", as used herein, refers to the dual nature of such regions in that they can function as either a source or a drain depending upon the applied voltage. When referring to a specific operation in a memory cell in accordance with the present invention wherein one region serves as the source and the other region serves as the drain, the terms "source" and "drain" may be used separately in reference to the particular region. However, the use of either term is not to be construed as limiting either region in its function, or as limiting the invention in regard to any specific location of the source and the drain.

A memory device in accordance with the present invention may comprise a semiconductor layer having more than two source/drain regions constituting a plurality of memory cells. It is to be understood that any one source/drain region may function as a source or drain for both adjacent cells, or it may function as a drain for a source region in a cell adjacent in one direction and as a source for a drain region in a cell adjacent in another direction. For example, referring to FIG. 1, source/drain region 110 may serve as the source for both source/drain region 112 and another source/drain region (not shown) in an adjacent memory cell (not shown) disposed to the left of memory cell 100, when source/drain region 112 and the other source/drain region operate as drains. Conversely, source/drain region 110 may serve as the drain for both when source/drain region 112 and the other source/drain region operate as sources. Alternatively, for example, source/drain region 110 can serve as a drain for source/drain region 112 when source/drain region 112 operates as a source, and also serve as a source for another source/drain region (not shown) in an adjacent memory cell (not shown) which is disposed to the left of memory cell 100 when the other source/drain region operates as a drain.

In general, each of the at least two source/drain regions comprises an area below the surface of the semiconductor layer which is doped in a manner corresponding in complementary fashion to the type of semiconductor layer doping employed. In other words, where a p-type semiconductor layer is employed, the source/drain regions are n-doped, and vice versa. Thus, in preferred embodiments wherein the semiconductor layer comprises p-type silicon, the at least two source/drain regions will comprise n+ doped regions, preferably having a high dose of n-type doping. In more preferred embodiments of the present invention, the n+ doping will comprise ion implantation of one or more elements selected from arsenic, phosphorous, and nitrogen, wherein the dosage of ion implantation is about $10^{19}/cm^3$ to $10^{20}/cm^3$. Thus, in certain preferred embodiments, the at least two source/drain regions comprise n-doped buried diffusion implants.

The depth of the implantation of each of the at least two source/drain regions in the silicon semiconductor layer can extend about 30 to about 200 nanometers below the semiconductor layer surface, depending on the technology generation or node of the device (i.e., the minimum feature size, for example 130 nm). For example, in one embodiment of the present invention with a generation node of 130 nanometers, the depth of the implantation of the at least two source/drain regions can be about 100 nanometers into the semiconductor layer as measured from the semiconductor layer surface. As used herein, reference to the source/drain regions being disposed "below" the surface of the semiconductor layer includes source/drain regions in which the doped areas extend to and include the surface of the semiconductor layer. In other words, there is no requirement that any source/drain region be disposed entirely below the semiconductor layer surface. This invention could not only be applied to a conventional silicon semiconductor layer but also to an SOI (silicon on insulator), TFT (thin film transistor) process, or a vertical transistor process.

The present invention also includes memory arrays comprising a plurality of memory cells. In certain embodiments of memory arrays in accordance with the present invention, two or more memory cells can be aligned in a row such that the source/drain regions on either side of the row of the two or more cells comprise continuous buried diffusion bit lines. Each bit line comprises a continuous doped region disposed below the surface of the semiconductor layer. Arrays comprising a plurality of memory cells in accordance with the present invention my further comprise various select transistors and/or common source lines suitable to effect operation of the array in accordance with various memory types, including but not limited to, NOR and/or NAND-type memories.

Additionally, in certain embodiments of the present invention, pocket implantation of oppositely doped regions adjacent to one or more of the source/drain (or bit line) regions may be carried out to provide pocket implants. For example, where the at least two source/drain regions comprise n+ doped regions, additional pocket implantation of a highly p-doped smaller area or areas adjacent to one or more of the source/drain regions may be carried out. Thus, memory cells in accordance with the present invention may further comprise an oppositely doped pocket implant adjacent to one or more of the source/drain regions.

Any method for carrying out ion implantation known in the art or to be developed may be employed for doping a region in accordance with any of the embodiments of the present invention.

Memory cells in accordance with the present invention may optionally include a dielectric material which can be disposed above a surface of the semiconductor layer over one or more of the at least two source/drain regions. In certain embodiments of the present invention, the dielectric material disposed above, and preferably on, a surface of the semiconductor layer over at least one of the at least two source/drain regions is preferably a high density plasma dielectric material or any other dielectric material capable of completely filling small (e.g., sub-micron) spaces with a minimum occurrence of voids, and more preferably, no voids. Preferably, the dielectric material comprises a high density plasma oxide. In the most preferred embodiments of the present invention, the high density plasma dielectric material will comprise silicon dioxide.

In certain preferred embodiments of the present invention, the memory cells can have a dielectric material, or more preferably a high density plasma dielectric material, disposed above, and preferably on, the surface of the semiconductor layer above each of the source/drain regions. In some embodiments of the present invention, a memory cell can include one or more layers, such as, for example, a gate oxide layer, between the surface of the silicon semiconductor layer and the dielectric material. A gate oxide layer can be grown thermally on the surface of the semiconductor layer, and in certain preferred embodiments wherein the semiconductor layer comprises silicon, a gate oxide layer can comprise silicon dioxide.

Each pair of source/drain regions in accordance with the present invention is separated by a channel region. The channel region refers to the area of the semiconductor layer between the two source/drain regions in which charge carriers migrate from one source/drain region to the other source/drain region when appropriate voltage potentials are applied to the source, drain and gates. Thus, for example, referring to FIG. 1, channel 115 generally comprises the portion of the semiconductor layer between source/drain regions 110 and 112. As used herein, "channel length" refers to the distance from one source/drain region to the other source/drain region across the channel region. "Channel width" refers to the measurement of the channel region in the direction perpendicular to the channel length.

A memory cell in accordance with the present invention comprises a lower insulating layer. For example, referring to FIG. 1, memory cell 100 includes a lower insulating layer 120 disposed above channel region 115. A lower insulating layer is generally disposed above the channel region. As used herein, "above" the channel region refers to the lower insulating layer's position over, but not necessarily in direct contact with, the surface of the semiconductor layer in the channel region. As mentioned above, a memory cell in accordance with the present invention can include one or more additional layers, such as a gate oxide layer, between the semiconductor layer and the lower insulating layer.

Suitable materials of which a lower insulating layer may be comprised include any high k-value dielectric material which provides electrical insulation between the semiconductor layer and charge storage layer. A lower k-value material or a pure oxide would also be adequate as this layer does not trap electrons or holes during read, program and erase operations. Electrons and holes could be tunneled when higher electric fields are applied. Suitable high k-value dielectric materials include, for example, silicon oxide, tantalum oxide, hafnium oxide, zirconium oxide, strontium titanate, barium strontium titanate, aluminum oxide, their silicates and mixtures thereof. A lower insulating layer is preferably formed of an oxide such as silicon oxide, aluminum oxide, and the like. In certain more preferred embodiments, a lower insulating layer comprises a silicon oxide.

The lower insulating layer is preferably between about 30-120 Angstroms (Å) in thickness and is based on operational voltage and the technology node. The lower insulating layer is preferably thicker than 30 Å in order to prevent direct-tunneling charge loss from a charge storage layer disposed above the lower insulating layer after the memory cell has been programmed (i.e., after charge has been stored in the charge storage layer). Thus, a lower insulating layer serves as an insulator providing a barrier between charge carriers in the channel region of the semiconductor layer and the charge storage layer. The materials and thickness of the lower insulating layer may vary so long as insulation is provided other than when the barrier effect of the layer is intentionally overcome by the application of voltages to one or more to the at least two source/drain regions and gate of a cell during programming and/or reading of the cell.

Memory cells according to the present invention also comprise a charge-storage layer disposed above the lower insulating layer. As used herein, "above the lower insulating layer" refers to the location of the charge storage layer as being disposed over, but not necessarily in direct contact with, the lower insulating layer. A memory cell in accordance with the present invention may comprise one or more additional layers of material between the lower insulating layer and the charge storage layer. This additional layer might serve as either a tunneling enhancement or a trapping enhancement and thus might be another film.

The charge storage layer provides the programmable memory storage portion of the non-volatile memory cell. The charge storage layer is preferably a material that efficiently traps or stores charge after a programming operation which entails applying a programming voltage potential to the gate and one of the source/drain regions in order to induce charge into the charge storage layer. The charge storage layer preferably has a thickness of about 40-150 Å. Thinner layers may result in no trapping or poor efficiency. Thicker layers is not preferred due to the need for higher operational voltages.

A charge storage layer in accordance with the present invention can comprise a floating gate material, such as polysilicon, or a charge-trapping material. Polysilicon could not be operated in a two bits/cell mode due to that it is a conductor film and the charges will be distributed over all the film.

Polysilicon dots isolated by an oxide could be operated in a two bits/cell mode. In various preferred embodiments of the present invention, the charge storage layer comprises a charge trapping material. Charge-trapping materials suitable for use as the charge storage layer in the memory cells of the present invention include, but are not limited to, silicon nitrides, tantalum oxides, strontium titanates, barium strontium titanates, hafnium oxides, and the like. A charge-trapping layer may also comprise a layer of silicon dioxide having two separate islands of polycrystalline silicon, optionally sandwiched between two additional layers of silicon dioxide. A charge-trapping layer is preferably formed of a nitride, such as a silicon nitride (e.g., $Si_3N_4$), or a silicon oxynitride ($SiO_xN_y$).

As used herein, a "charge-trapping layer" refers to a material, layer or multi-layer structure which is capable of trapping localized charge, wherein localization refers to trapped charge carriers that exhibit little, if any, lateral movement within the trapping material. The charge-trapping layer may be any dielectric layer or layers that are capable of or facilitate charge carrier trapping. Accordingly, to facilitate charge carrier trapping, the charge-trapping layer generally comprises a material with a lower electron barrier height than the layers sandwiching it (i.e., two layers with relatively higher barrier heights sandwiching a layer of material with a relatively lower barrier height). For example, in the case of a silicon nitride charge-trapping layer interposed between two silicon oxide layers, such as, e.g., a silicon oxide lower insulating layer and a silicon oxide first dielectric layer, the oxide layers have a barrier height of about 3.1 eV, whereas the nitride layer has a barrier height of about 2.1 eV. Thus, an electron well is created in the middle nitride layer.

Many of the materials which are suitable for use in the lower insulating layer and first dielectric layer are the same, and both layers may preferably comprise an oxide, and more preferably silicon oxide. However, the interposed charge-trapping layer must be comprised of a different dielectric material having a lower barrier height to create the "trapping" region.

The various insulating, dielectric and charge-trapping layers may be formed by any suitable process known or to be developed for the formation or deposition of such materials. For example, where a layer comprises an oxide, the oxide layer may be formed via oxidation techniques including, but not limited to, thermal oxidation, chemical vapor deposition (CVD), low-pressure CVD (LPCVD), plasma-enhanced CVD (PECVD), or high-density plasma CVD (HDPCVD). Suitable processes for the deposition of a nitride layer include, but are not limited to nitridation, chemical vapor deposition and plasma-nitridation.

In certain preferred embodiments of the present invention, the lower insulating layer comprises an oxide, the charge-trapping layer comprises a nitride, and the first dielectric layer comprises an oxide. Even more preferably, the layers comprise silicon dioxide, silicon nitride, and silicon dioxide, respectively. As discussed below, it is also preferred that the first dielectric and the second dielectric layers each comprise and oxide, and more preferably, silicon dioxide.

In certain preferred embodiments where the lower insulating layer, the charge-trapping layer, and the first dielectric layer comprise $SiO_2$, $Si_3N_4$, and $SiO_2$, respectively, one or both of the silicon dioxide layers may be a silicon-rich silicon dioxide layer. One or both of the silicon dioxide layers may also be an oxygen-rich silicon dioxide layer. One or both of the silicon dioxide layers may be a thermally grown or a deposited oxide. One or both of the silicon dioxide layers may be nitrided oxide layers. The nitride may be a silicon-rich silicon nitride layer or a silicon nitride containing oxygen. The nitride may also be an nitrogen-rich silicon nitride layer.

Generally, each of the lower insulating layer, the charge storage layer and the layers of the upper insulating multi-layer structure can have length and width dimensions which correspond to the channel length and channel width. In other words, each layer can be about as wide as the at least two source/drain regions and can span the length of the channel separating the at least two source/drain regions.

Memory cells according to the present invention also include an upper insulating multi-layer structure. Upper insulating multi-layer structures in accordance with the present invention include a polysilicon material layer interposed between a first dielectric layer and a second dielectric layer. The upper insulating multi-layer structure is disposed above the charge storage layer. As with other references to layers disposed "above" other layers herein, the upper insulating multi-layer structure can be disposed over, but not necessarily in direct contact with, the upper surface of the charge storage layer. One or more additional layers, such as an additional insulating layer, may optionally be disposed between the charge storage layer and the upper insulating multi-layer structure.

The first dielectric layer and the second dielectric layer may be comprised of the same or different materials. Suitable materials of which the first and second dielectric layers may be comprised include high k-value dielectric materials include, for example, silicon oxide, tantalum oxide, hafnium oxide, zirconium oxide, strontium titanate, barium strontium titanate, aluminum oxide, their silicates and mixtures thereof. Preferably, the first dielectric layer comprises a silicon oxide, and most preferably silicon dioxide. Preferably, the second dielectric layer comprises a silicon oxide, and most preferably silicon dioxide. More preferably, both the first and second dielectric layers comprise a silicon oxide, and most preferably both comprise silicon dioxide.

The first dielectric layer can have a thickness of about 10 to about 40 Å, and preferably at least about 25 Å. The thickness of this layer is important for hole tunneling between the gate and the charge storage layer. The preferred thickness is 13-18 Å. The second dielectric layer can have a thickness of about 10 to about 40 Å. The thickness of the second dielectric layer is important to retention and reliability. The preferred thickness is 25 Å.

The upper insulating multi-layer structure comprises a polysilicon material layer. The polysilicon material layer can comprise undoped polysilicon or doped polysilicon. Doped polysilicon materials can be n-doped or p-doped at any dopant level. The upper insulating multi-layer structure can have a thickness of about 5 to about 40 Å. The preferred range is 10-20 Å.

The polysilicon material layer may be formed in any suitable manner known or to be developed. For example, the polysilicon can be deposited via CVD or PVD. In those embodiments wherein the polysilicon material is doped, the polysilicon can be doped via ion implantation method known or to be developed, or may optionally be doped during deposition. If the polysilicon is doped, the thickness should be 10-40 Å.

In certain preferred embodiments of the present invention, the upper insulating multi-layer structure comprises an undoped polysilicon material layer having a thickness of about 30 Å, interposed between a first dielectric layer comprising silicon dioxide and having a thickness of about 30 Å, and a second dielectric layer comprising silicon dioxide and having a thickness of about 30 Å.

Memory cells in accordance with the present invention also include a gate disposed above the upper insulating multi-layer structure. As used herein, "above the upper insulating multi-layer structure" refers to spatial placement of the gate on, or over, but not necessarily in direct contact with, the upper surface of the upper insulating multi-layer structure. Accordingly, a gate in a memory cell of the present invention may be disposed directly on the upper dielectric layer of the upper insulating multi-layer structure, or a gate may be separated from the upper insulating multi-layer structure by an additional material such as, for example, an additional insulating material. Preferably, a gate is disposed directly on the upper dielectric layer of the upper insulating multi-layer structure.

A gate in accordance with the present invention can comprise any conductive material. Gates in accordance with the present invention preferably comprises a polysilicon layer, which may be either n-type or p-type doped, and a metal silicide layer disposed above the polysilicon layer. The thickness of the polysilicon gate layer is preferably about 30 nanometers to about 200 nanometers. In certain more preferred embodiments of the present invention, the polysilicon is p-type doped. The metal silicide gate layer in accordance with preferred embodiments of the present invention can comprise a metal silicide material selected from tungsten silicide, titanium silicide, cobalt silicide, and nickel silicide.

Gate material layers can be formed by any suitable process for the deposition of a metal, metal-containing material, polycrystalline silicon, or other conductive material. Metals can be deposited using any metallization process known or to be developed. Metal-containing materials such as metal silicides can be deposited, for example, by sputtering, or CVD. CVD processes are preferred for forming metal suicides. Polycrystalline silicon materials can be deposited by any method known or to be developed, such as a CVD process with $SiH_4$ or dicloro-$SiH_4$ and the polycrystalline silicon may be doped during or after deposition on the semiconductor layer.

The present invention also includes methods of operating a memory cell in accordance with any of the embodiments described above. Methods in accordance with the present invention include applying a positive voltage to the gate of a memory cell in accordance with an embodiment of the present invention, where the positive voltage is sufficient to cause hole tunneling from the gate toward the charge storage layer. Methods in accordance with the present invention include erasing and/or resetting memory cells and arrays thereof by applying a positive voltage to the gate or gates.

Suitable positive voltages to be applied to the gate of a memory cell in accordance with certain preferred embodiments of the present invention can be about 10 to about 15 volts. 13 volts is preferred. A positive voltage is generally applied to the gate of the memory cell for a period of time to reduce the threshold voltage of the cell to its erased state. Suitable erase time in accordance with certain preferred embodiments of the present invention wherein the positive voltage is about 10 to about 15 volts can be about 100 to about 500 milliseconds. Preferred erase time is 200-400 ms.

Memory cells in accordance with the present invention can be programmed via various hot electron methods, including, for example, channel-hot-electron (CHE) operations. Additional programming methods which are suitable include —FN tunneling. Positive voltage programming is preferable. Memory cells in accordance with the present invention can be read in a forward or reverse direction. For two bit/cell operation reverse read is used to distinguish the trapped bits.

Memory cells in accordance with the present invention can be fully operated (programmed/read/erased) employing an all positive voltage system. For example, as shown below in Table 1, a cell in accordance with one embodiment of the present invention, having an NPN junction structure, wherein the lower insulating layer and the dielectric layers comprise silicon dioxide, the charge-trapping layer comprises silicon nitride, the polysilicon material layer is undoped and the gate comprises p-doped polysilicon, each of programming, erasing and reading can be carried out with all applied voltages being positive.

TABLE 1

| Operation: | $V_G$ (V) | $V_D$ (V) | $V_S = V_B$ (V) | Time |
|---|---|---|---|---|
| Program | 9 | 5 | 0 | 5 µs |
| Erase | 12.5 | 0 | 0 | 400 ms |
| Read | 3 | 1.6 | 0 | — |

Figure 2:
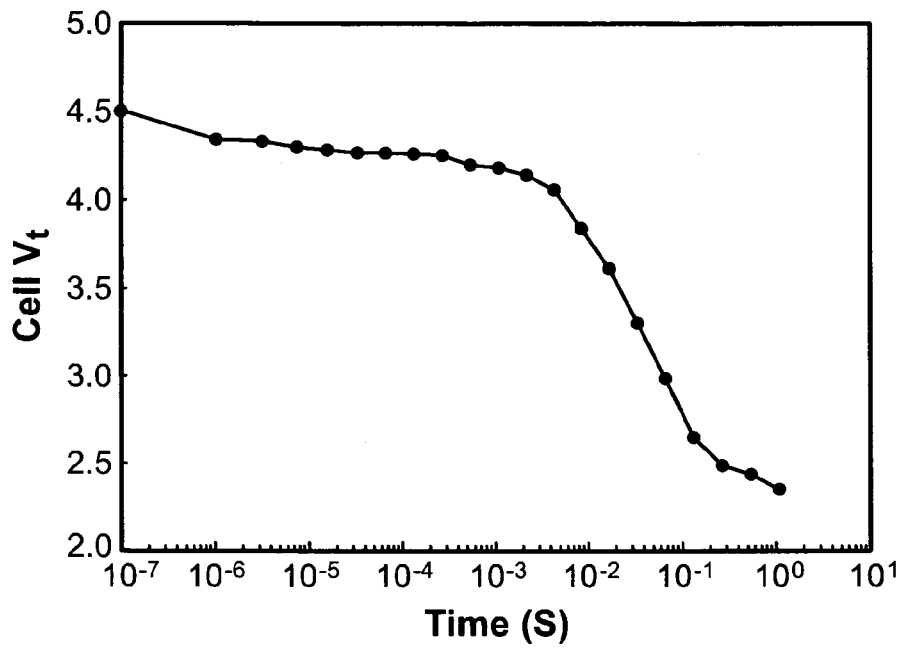
FIG. 2 is a graphical representation of the threshold voltage of a memory cell in accordance with one embodiment of the present invention over time during a +13V erase operation.

FIG. 2 shows the threshold voltage of a cell, as described in the preceding paragraph, wherein the thickness of the lower insulating layer was 50 Å, the charge-trapping layer had a thickness of 70 Å, the polysilicon material layer had a thickness of 20 Å, the first dielectric layer had a thickness of 18 Å, and the second dielectric layer had a thickness of 18 Å ("the Example Cell"), over time during an erase operation wherein a positive voltage of 13V was applied to the gate. As shown in FIG. 2, the threshold voltage is reduced from about 4.5V to less than about 2.5V with the positive gate voltage indicating successful hole tunneling from the gate.

Figure 3:
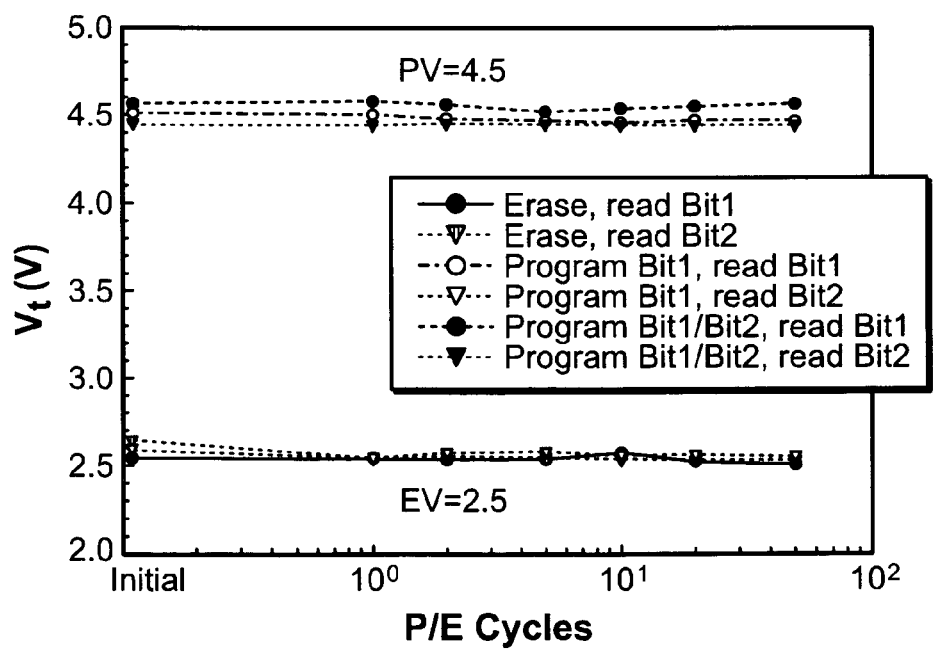
FIG. 3 is a graphical representation of the threshold voltage of a memory cell in accordance with one embodiment of the present invention over several program/erase (P/E) cycles.

FIG. 3 shows the operational performance of the Example Cell over the course of 50 program/erase (P/E) cycles. The cell window of operation is excellent as the programmed threshold voltage and the erased threshold voltage remain relatively constant.

Figure 4:
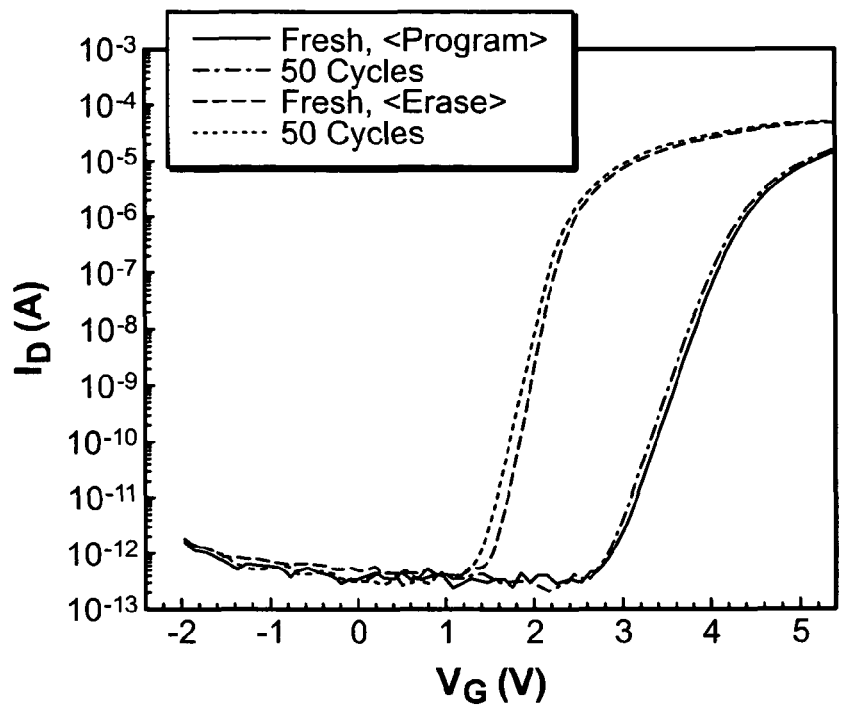
FIG. 4 is a graphical representation of drain current versus gate voltage in a memory cell in accordance with one embodiment of the present invention during erase and program operations initially with a fresh cell with mostly no interface damage and after 50 P/E cycles.
Figure 5:
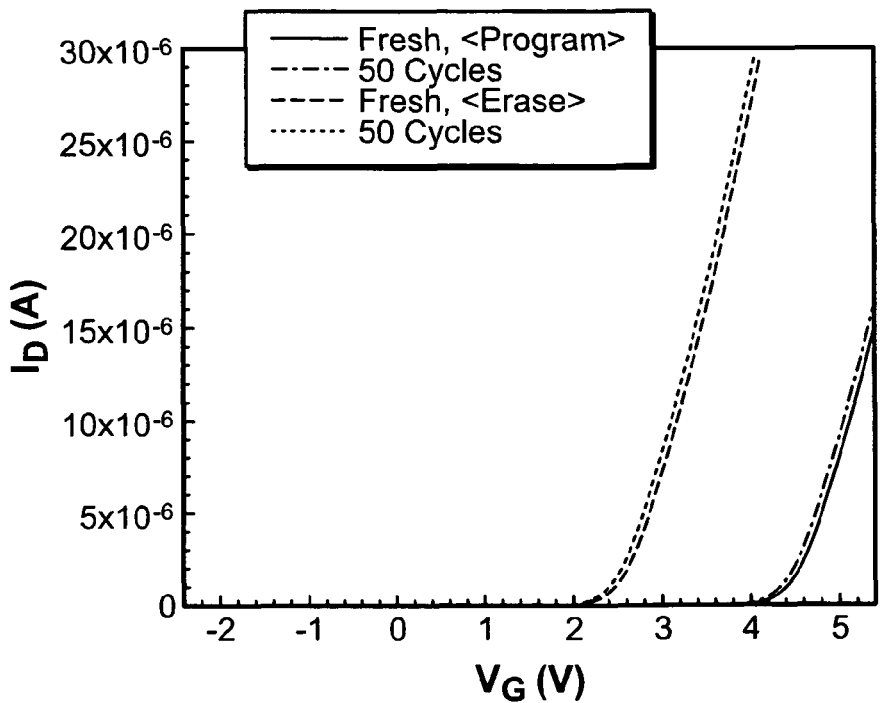
FIG. 5 is a graphical representation of a magnified portion of FIG. 4.

FIG. 4 also shows the excellent performance of the Example Cell over the course of 50 P/E cycles. In FIG. 4, the drain current is plotted against the gate voltage during both program and erase operations for the cell when fresh and after 50 cycles. As indicated in the graph, the values are nearly identical which evidences minimal degradation, if any. FIG. 5 magnifies the sub-threshold portion of the graph in FIG. 4 and shows that the cell performance after 50 cycles is nearly identical to the fresh cell.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

What is claimed is:

1. A memory cell comprising:
   (i) a semiconductor layer having at least two source/drain regions proximate the surface of the semiconductor layer and separated by a channel region;
   (ii) a lower insulating layer disposed above the channel region;
   (iii) a charge storage layer disposed above the lower insulating layer;
   (iv) an upper insulating multi-layer structure disposed above the charge storage layer, wherein the upper insulating multi-layer structure comprises a polysilicon material interposed between a first dielectric layer and a second dielectric layer of a single material layer, and the first dielectric layer of the upper insulating multi-layer structure is disposed directly on and in contact with the charge storage layer, the polysilicon layer is disposed directly on and in contact with the first dielectric layer, and the second dielectric layer is disposed directly on and in contact with the polysilicon layer; and
   (v) a gate disposed directly on and in contact with the second dielectric layer of the upper insulating multi-layer structure.

2. The memory cell of claim 1, wherein the memory cell further comprises a semiconductor substrate, the semiconductor substrate being one of silicon on insulator, silicon, dielectric, or carrier.

3. The memory cell of claim 2, wherein the semiconductor substrate is a carrier semiconductor substrate, the carrier semiconductor substrate is constituted with a material comprising at least one of silicon carbide, glass, and sapphire.

4. The memory cell according to claim 1, wherein the semiconductor layer comprises p-doped silicon and wherein each of the at least two source/drain regions comprises an n-doped buried diffusion implant.

5. The memory cell according to claim 1, wherein the lower insulating layer comprises an oxide.

6. The memory cell according to claim 5, wherein the lower insulating layer has a thickness of about 30 to 120 Angstroms.

7. The memory cell according to claim 1, wherein the charge storage layer comprises a charge-trapping layer.

8. The memory cell according to claim 1, wherein the charge storage layer comprises a nitride.

9. The memory cell according to claim 1, wherein the charge storage layer comprises a silicon nitride.

10. The memory cell according to claim 9, wherein the charge storage layer has a thickness of about 40 to 150 Angstroms.

11. The memory cell according to claim 1, wherein the polysilicon material layer has a thickness of about 10 to 30 Angstroms.

12. The memory cell according to claim 1, wherein each of the first dielectric layer and the second dielectric layer comprises a silicon oxide.

13. The memory cell according to claim 12, wherein the first dielectric layer has a thickness of about 25 Angstroms and the second dielectric layer has a thickness of about 10 to 40 Angstroms.

14. The memory cell according to claim 11, wherein each of the first dielectric layer and the second dielectric layer comprises a silicon oxide.

15. The memory cell according to claim 14, wherein the first dielectric layer has a thickness of about 25 Angstroms and the second dielectric layer has a thickness of about 10 to 40 Angstroms.

16. The memory cell according to claim 1, wherein the gate comprises p-doped polysilicon.

17. The memory cell according to claim 1, wherein the lower insulating layer comprises an oxide, wherein the charge storage layer comprises a nitride, wherein each of the first dielectric layer and the second dielectric layer comprises a silicon oxide, and wherein the gate comprises p-doped polysilicon.

18. A memory array comprising a plurality of memory cells according to claim 1.

19. A memory cell comprising:
(i) a silicon semiconductor layer having at least two source/drain regions disposed below a surface of the semiconductor layer and separated by a channel region;
(ii) a silicon oxide insulating layer disposed above the channel region;
(iii) a silicon nitride charge storage layer disposed above the silicon oxide insulating layer;
(iv) an upper insulating multi-layer structure disposed above the charge storage layer, wherein the upper insulating multi-layer structure comprises a polysilicon material interposed between a first silicon oxide dielectric layer and a second silicon oxide dielectric layer, wherein the polysilicon material has a thickness of about 10 to 30 Angstroms, the first silicon oxide dielectric layer has a thickness of about 10 to 40 Angstroms, and the second silicon oxide dielectric layer has a thickness of about 10 to 40 Angstroms, and the first silicon oxide dielectric layer is disposed directly on and in contact with the charge storage layer, and the polysilcion layer is disposed directly on and in contact with the first silicon oxide dielectric layer, and the second silicon oxide dielectric layer is disposed directly on and in contact with the polysilicon layer; and
(v) a gate disposed directly on and in contact with the second silicon oxide dielectric layer of the upper insulating multi-layer structure.

20. The memory cell of claim 19, wherein the memory cell further comprises a semiconductor substrate, the semiconductor substrate being one of silicon on insulator, silicon, dielectric, or carrier.

21. The memory cell of claim 20, wherein the semiconductor substrate is a carrier semiconductor substrate, the carrier semiconductor substrate is constituted with a material comprising at least one of silicon carbide, glass, and sapphire.

22. A memory array comprising a plurality of memory cells according to claim 19.

23. A method comprising:
providing a memory cell comprising:
(i) a semiconductor layer having at least two source/drain regions proximate the surface of the semiconductor layer and separated by a channel region;
(ii) a lower insulating layer disposed above the channel region;
(iii) a charge storage layer disposed above the lower insulating layer;
(iv) an upper hole-tunneling multi-layer structure disposed above the charge storage layer, wherein the upper hole-tunneling multi-layer structure comprises a polysilicon material interposed between a first dielectric layer and a second dielectric layer; and
(v) a gate disposed above the upper hole-tunneling multi-layer structure; and
applying a positive voltage to the gate sufficient to cause hole tunneling from the gate toward the charge storage layer.

24. The method of claim 23, wherein the memory cell further comprises a semiconductor substrate, the semiconductor substrate being one of silicon on insulator, silicon, dielectric, or carrier.

25. The method of claim 24, wherein the semiconductor substrate is a carrier semiconductor substrate, the carrier semiconductor substrate is constituted with a material comprising at least one of silicon carbide, glass, and sapphire.

26. The method according to claim 23, wherein the positive voltage is about 10 to 15 volts.

27. The method according to claim 23, wherein the positive voltage is applied for a period of time of about 200 to 500 milliseconds.

28. The method according to claim 23, wherein the gate comprises p-doped polysilicon.

29. The method according to claim 28, wherein the positive voltage is about 10 to 15 volts.

30. The method according to claim 28, wherein the positive voltage is applied for a period of time of about 200 to 500 milliseconds.

31. The method according to claim 29, wherein the positive voltage is applied for a period of time of about 200 to 500 milliseconds.

* * * * *